United States Patent
Lee et al.

(10) Patent No.: US 9,804,306 B2
(45) Date of Patent: Oct. 31, 2017

(54) COLOR FILTER SUBSTRATE AND DISPLAY PANEL INCLUDING THE SAME

(71) Applicant: Samsung Display Co. Ltd., Yongin, Gyeonggi-Do (KR)

(72) Inventors: Minsu Lee, Seoul (KR); Jin-Young Kim, Hwaseong-si (KR); YongHoon Yang, Hwaseong-si (KR); Jin Hyeong Lee, Seoul (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/709,965

(22) Filed: May 12, 2015

(65) Prior Publication Data

US 2016/0202400 A1 Jul. 14, 2016

(30) Foreign Application Priority Data

Jan. 9, 2015 (KR) ........................ 10-2015-0003190

(51) Int. Cl.
  *G02B 5/20* (2006.01)
  *G02B 5/22* (2006.01)
  *H01L 27/32* (2006.01)

(52) U.S. Cl.
  CPC .............. *G02B 5/206* (2013.01); *G02B 5/223* (2013.01); *H01L 27/322* (2013.01)

(58) Field of Classification Search
  CPC ........ G02B 5/206; G02B 5/223; H01L 27/322
  See application file for complete search history.

(56) References Cited

U.S. PATENT DOCUMENTS

| | | | | |
|---|---|---|---|---|
| 5,871,872 | A | * | 2/1999 | Matijevic ............... B41M 3/003 106/483 |
| 5,952,137 | A | * | 9/1999 | Ihara .................... C09D 11/037 313/112 |
| 6,999,222 | B2 | | 2/2006 | Bazan et al. |
| 8,211,597 | B2 | | 7/2012 | Su et al. |
| 2005/0146724 | A1 | | 7/2005 | Malak |
| 2012/0064134 | A1 | | 3/2012 | Bourke, Jr. et al. |
| 2012/0326180 | A1 | * | 12/2012 | Ohe ..................... H01L 27/322 257/88 |
| 2015/0293280 | A1 | | 10/2015 | Lee et al. |

FOREIGN PATENT DOCUMENTS

| | | |
|---|---|---|
| JP | 2011-180186 A | 9/2011 |
| KR | 10-2013-0073539 A | 7/2013 |
| KR | 10-2015-0117343 | 10/2015 |
| KR | 10-2015-0117343 A | 10/2015 |

* cited by examiner

*Primary Examiner* — Kyoung Lee
(74) *Attorney, Agent, or Firm* — Knobbe, Martens Olson & Bear LLP

(57) ABSTRACT

A color filter substrate comprises an insulating substrate and a color filter layer including a blue color filter and a green color filter spaced apart from each other on the insulating substrate, wherein the blue color filter includes first metal particles having a first mean diameter, and the green color filter includes second metal particles having a second mean diameter larger than the first mean diameter.

20 Claims, 8 Drawing Sheets

COLOR FILTER SUBSTRATE AND DISPLAY PANEL INCLUDING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority from and the benefit of Korean Patent Application No. 10-2015-0003190, filed on Jan. 9, 2015, which is hereby incorporated herein by reference in its entirety.

BACKGROUND

Field

The present disclosure relates to a color filter substrate and a display panel including the same.

Description of the Related Technology

Display devices are devices for visually displaying data. With advances in the information age, needs for image display devices are increasing in a variety of forms, and recently, various types of flat panel displays such as liquid crystal displays (LCDs), plasma display panels (PDPs), organic light emitting diode (OLED) displays are being utilized.

Organic light emitting diodes are self-luminous elements having advantages of wide view angle, excellent contrast, rapid response time, superior characteristics of luminance, driving voltage and response speed, and pleochroism. An organic light emitting diode may typically have a structure in that an anode is formed on a substrate, and a hole transport layer (HTL), an emission layer (EML), an electron transport layer (ETL) and a cathode are sequentially formed on the anode. In this case, the hole transport layer (HTL), the emission layer (EML) and the electron transport layer (ETL) are organic thin films made of organic compounds.

When voltage is applied between the anode and the cathode, holes injected from the anode move to the emission layer (EML) via the hole transport layer (HTL), and electrons injected from the cathode move to the emission layer (EML) via the electron transport layer (ETL). Carriers such as holes and electrons are recombined in the emission layer (EML) to form an exciton. The exciton changes from an excited state to a bottom state to emit light.

SUMMARY

Exemplary embodiments provide a color filter substrate and a display panel with increased luminance of color.

Exemplary embodiments provide a color filter substrate and a display panel with a large economical advantage or improved processability.

Additional aspects will be set forth in the detailed description which follows, and, in part, will be apparent from the description, or may be learned by practice of the presented embodiments.

A color filter substrate according to an exemplary embodiment, comprises an insulating substrate and a color filter layer including a blue color filter and a green color filter spaced apart from each other on the insulating substrate. The blue color filter includes first metal particles having a first mean diameter, and the green color filter includes second metal particles having a second mean diameter larger than the first mean diameter.

The color filter layer may further comprise a red color filter, the red color filter may be spaced apart from the blue color filter and the green color filter, and the red color filter may include third metal particles having a third mean diameter larger than the second mean diameter.

A color filter substrate according to another exemplary embodiment, comprises an insulating substrate and a color filter layer including a blue color filter and a green color filter spaced apart from each other on the insulating substrate. Each of the blue color filter and the green color filter includes surface-modified metal particles including metal particles and a hydrocarbon compound surface modification layer covering the metal particles. The blue color filter includes first metal particles having a first mean diameter, and the green color filter includes second metal particles having a second mean diameter larger than the first mean diameter.

The color filter layer may further comprises a red color filter, the red color filter may be spaced apart from the blue color filter and the green color filter, and the red color filter may include surface-modified metal particles including metal particles and a hydrocarbon compound surface modification layer covering the metal particles. The red color filter may include third metal particles having a third mean diameter larger than the second mean diameter.

Each of the first metal particles, the second metal particles, and the third metal particles may be one or more selected from a group consisting of gold (Au), silver (Ag), aluminum (Al), alumina ($Al_2O_3$), cobalt (Co), copper (Cu), chrome (Cr), platinum (Pt), nickel (Ni), iron (Fe), molybdenum (Mo) and tungsten (W).

The blue color filter may include, as the metal particles, silver particles having a mean diameter ranging from 20 nm to 40 nm, the green color filter may include, as the metal particles, silver particles having a mean diameter exceeding 40 nm but not exceeding 70 nm, and the red color filter may include, as the metal particles, silver particles having a mean diameter exceeding 70 nm but not exceeding 100 nm.

The first metal particles, the second metal particles, and the third metal particles each may be spherical metal particles.

The color filter substrate may further comprise an opaque layer disposed on the insulating substrate between the green color filter and the blue color filter.

The color filter substrate may further comprise an overcoat layer disposed on the color filter layer and the opaque layer.

The color filter substrate may further comprise a common electrode disposed on the overcoat layer.

The hydrocarbon compounds may have 6 to 20 carbon atoms.

The hydrocarbon compounds may be one or more saturated hydrocarbon compounds selected from a group consisting of hexane ($C_6H_{14}$), heptane ($C_7H_{16}$), octane ($C_8H_{18}$), nonane ($C_9H_{20}$), decane ($C_{10}H_{22}$), undecane ($C_{11}H_{24}$), dodecane ($C_{12}H_{26}$), tridecane ($C_{13}H_{28}$), tetradecane ($C_{14}H_{30}$), pentadecane ($C_{15}H_{32}$), hexadecane ($C_{16}H_{34}$), heptadecane ($C_{17}H_{36}$), octadecane ($C_{18}H_{38}$), nonadecane ($C_{19}H_{40}$) and eicosane ($C_{20}H_{42}$).

A display panel according to an exemplary embodiment, comprises the color filter substrate and an opposed substrate facing the color filter substrate.

The opposed substrate may further comprise an organic emission layer formed on the insulating substrate.

According to some embodiments, there is provided a color filter substrate and a display panel with increased luminance of color.

According to some embodiments, there is provided a color filter substrate and a display panel in which a hydrocarbon surface modification layer is capable of improving particle dispersibility to thus eliminate the necessity of using an existing leveling agent, providing an economical advantage.

However, effects of the present disclosure are not restricted to the exemplary embodiments set forth herein and more diverse effects are included in this description.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the disclosure.

DETAILED DESCRIPTION

Figure 1:
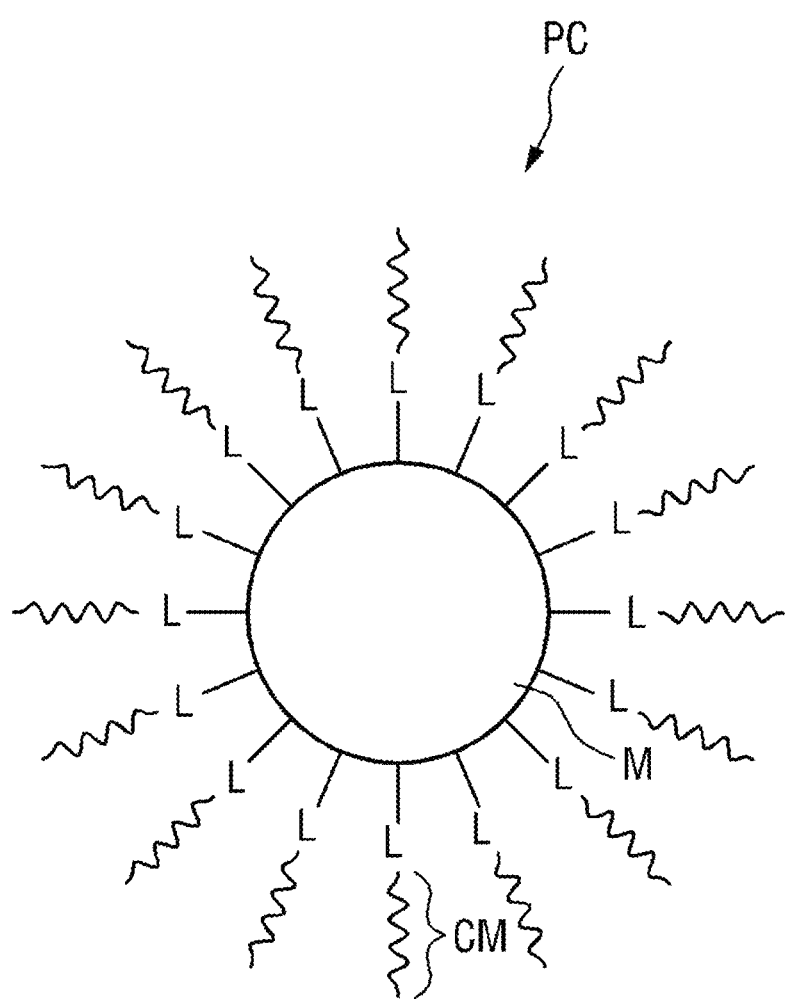
FIG. 1 is a schematic diagram of surface-modified metal particles according to an exemplary embodiment.

The present disclosure is described more fully hereinafter with reference to the accompanying drawings, in which embodiments are shown. This disclosure may, however, be embodied in many different forms and should not be construed as limited to the embodiments set forth herein. Rather, these embodiments are provided so that this disclosure is thorough, and will fully convey the scope to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

As used herein, the term "and/or" includes any and all combinations of one or more of the associated listed items. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings.

It will be understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Exemplary embodiments will now be described with reference to the drawings.

FIG. 1 is a schematic diagram of surface-modified metal particles according to an exemplary embodiment. Referring to FIG. 1, a surface-modified metal particle PC may include a metal particle M, a surface modification layer formed of hydrocarbon compounds CM, and linkers L.

The metal particle M may be one or more selected from a group consisting of gold (Au), silver (Ag), aluminum (Al), alumina ($Al_2O_3$), cobalt (Co), copper (Cu), chrome (Cr), platinum (Pt), nickel (Ni), iron (Fe), molybdenum (Mo) and tungsten (W). The metal particle M may be a spherical metal particle.

The hydrocarbon compounds CM may have 6 to 20 carbon atoms, and in a non-limiting example, the hydrocarbon compounds CM may be one or more saturated hydrocarbon compounds selected from a group consisting of hexane ($C_6H_{14}$), heptane ($C_7H_{16}$), octane ($C_8H_{18}$), nonane ($C_9H_{20}$), decane ($C_{10}H_{22}$), undecane ($C_{11}H_{24}$), dodecane ($C_{12}H_{26}$), tridecane ($C_{13}H_{28}$), tetradecane ($C_{14}H_{30}$), pentadecane ($C_{15}H_{32}$), hexadecane ($C_{16}H_{34}$), heptadecane ($C_{17}H_{36}$), octadecane ($C_{18}H_{38}$), nonadecane ($C_{19}H_{40}$) and eicosane ($C_{20}H_{42}$).

The linker L may chemically bond the hydrocarbon compound CM to a surface of the metal particle M. In a non-limiting example, the linker L may be one selected from a group consisting of a hydroxyl group (—OH), an amine group (—N—, —NH, —$NH_2$), a thiol group (—SH), an aldehyde group (—COH) and a carboxyl group (—COOH), Si, —C=O—, —COO—, —($SO_2$)—, —O($SO_2$)—, —O($SO_2$)O—, —(P=O)$O_2$— and, —O(P=O)$O_2$—.

Figure 2:
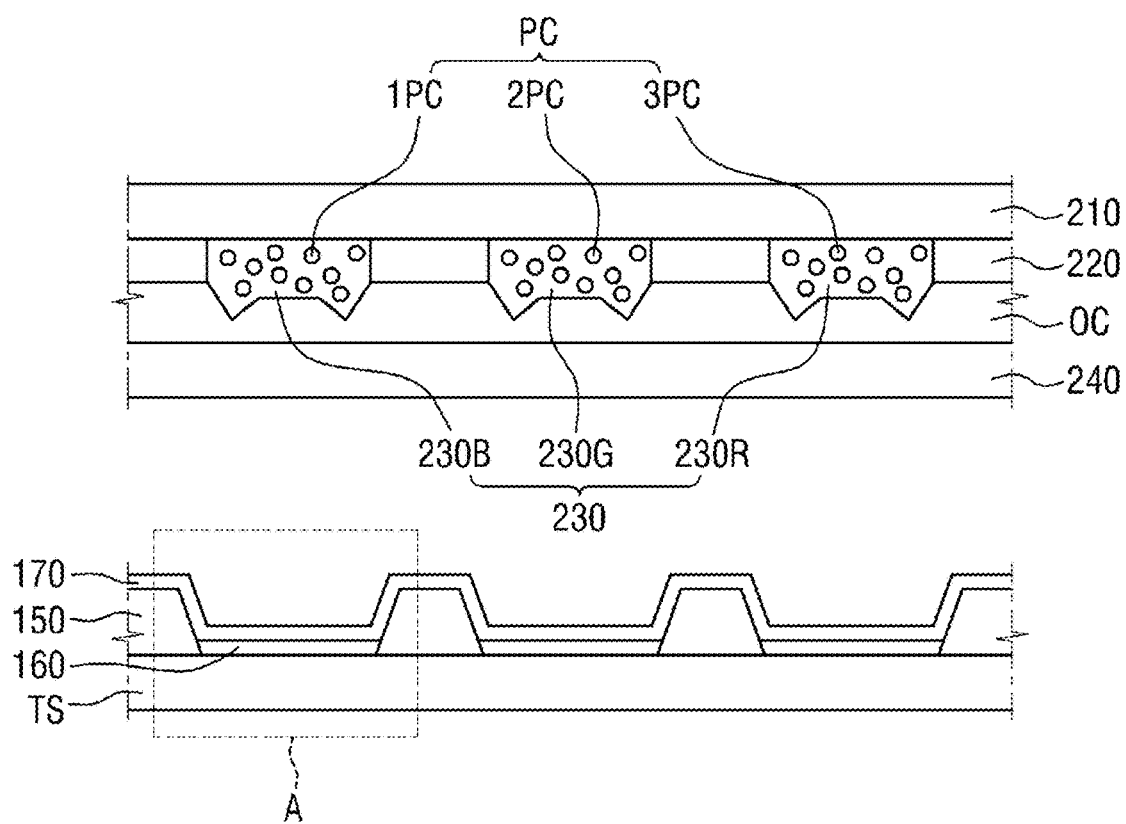
FIG. 2 is a schematic cross-sectional view of a display panel according to an exemplary embodiment.
Figure 3:
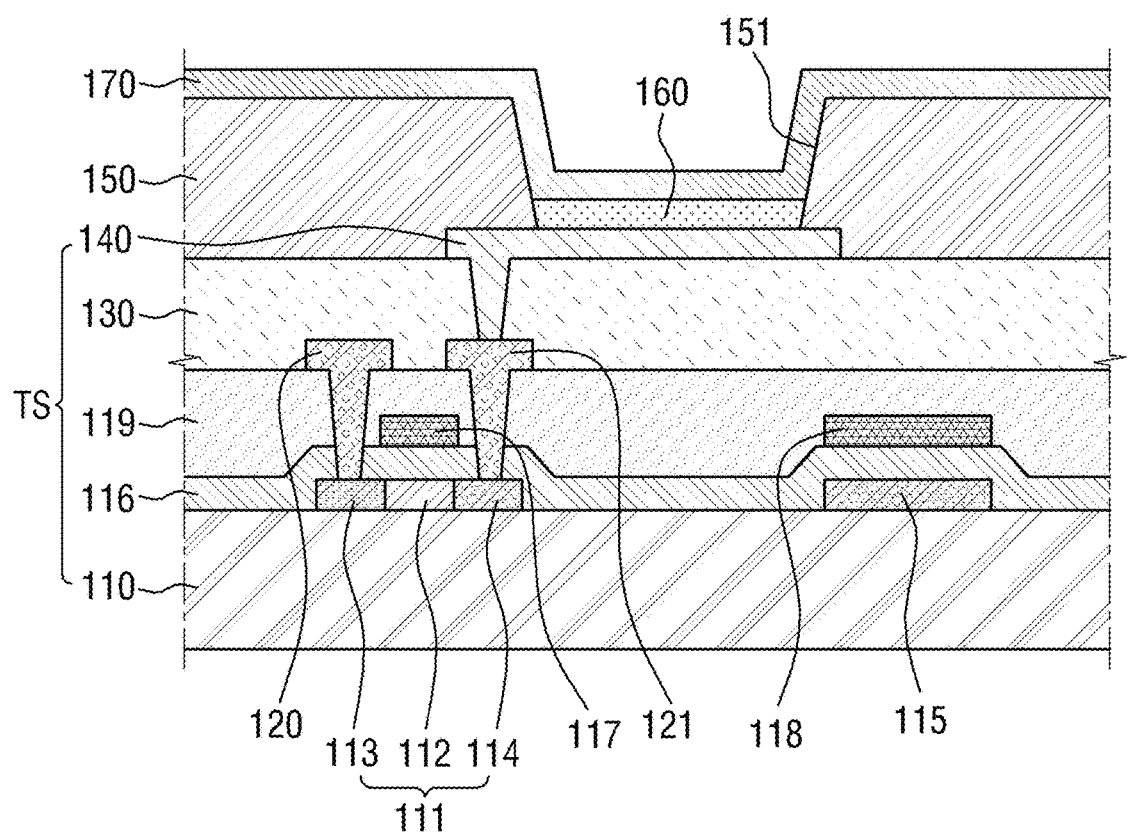
FIG. 3 is an enlarged schematic cross-sectional view of region A of FIG. 2.

FIG. 2 is a schematic cross-sectional view of a display panel according to an exemplary embodiment. FIG. 3 is an enlarged schematic cross-sectional view of region A of FIG. 2.

Referring to FIG. 2 and FIG. 3, a display panel may include a thin film transistor substrate TS including a first insulating substrate 110, an active layer 111, a lower electrode 115, a gate insulating layer 116, a gate electrode 117, an upper electrode 118, an interlayer insulating layer 119, a source electrode 120, a drain electrode 121, a flattening pattern 130, and a first electrode 140; a lower substrate including a pixel define layer 150, an organic layer 160, and a second electrode 170; and a color filter substrate including a second insulating substrate 210, an opaque layer 220, a color filter layer 230, an overcoat layer OC, and a common electrode 240.

The first insulating substrate 110 may be transparent. The first insulating substrate 110 may be formed of a material such as glass, quartz, and polymer resin. Examples of the polymer material include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT or TAC), cellulose acetate propionate: CAP) or a combination thereof. In some embodiments, the insulating substrate may be a flexible substrate formed of a flexible material such as polyimide (PI).

The active layer 111 may be formed on the first insulating substrate 110, and may include a channel region 112, and a source region 113 and a drain region 114 arranged at both sides of the channel region 112. The active layer 111 may be formed of silicon, for example, amorphous silicon or poly silicon, and the source region 113 and the drain region 114 may be doped with p-type or n-type impurities. The active layer 111 may be formed by a photolithography method or the like, but is not limited thereto.

The lower electrode 115 may be disposed of the same layer as the active layer 111 on the first insulating substrate 110, and may be spaced apart from the active layer 111. The lower electrode 115 may be formed of a material same as that of the source region 113 or the drain region 114. That is, the lower electrode 115 may be formed of silicon, and may include p-type or n-type impurities. The lower electrode 115 is formed by a photolithograpy method or the like, but is not limited thereto.

The gate insulating layer 116 is formed on the first insulating substrate 110 to cover the active layer 111 and the lower electrode 115. The gate insulating layer 116 electrically insulates the gate electrode 117 and the active layer 111 from each other. The gate insulating layer 116 may be formed of an insulating material, for example, silicon oxide (SiOx), silicon nitride (SiNx), metal oxide or the like. The gate insulating layer 116 may be formed by a deposition method or the like, but is not limited thereto.

The gate electrode 117 may be formed on the gate insulating layer 116. The gate electrode 117 may be formed above the channel region 112, that is, on a portion of an upper surface of the gate insulating layer 116 overlapped with the channel region 112. The gate electrode 117 may include metal, alloy, metal nitride, conductive metal oxide, transparent conductive materials, etc. The gate electrode 117 may be formed by a photolithography method or the like, but is not limited thereto.

The upper electrode 118 may be formed of the same layer as the gate electrode 117, and may be formed of a material same as that of the gate electrode 117. The upper electrode 118 may be formed above the lower electrode 115, that is, on a portion of an upper surface the gate insulating layer 116 overlapped with the lower electrode 115. Thus-formed upper electrode 118 forms a storage capacitor Cst together with the lower electrode 115 and the gate insulating layer 116. The storage capacitor Cst stores therein voltage to be applied to the gate electrode 117 of a thin film transistor (TFT). The upper electrode 117 may be formed by a photolithography or the like, but is not limited thereto.

The interlayer insulating layer 119 may be formed on the gate insulating layer 116 to cover the gate electrode 117 and the upper electrode 118. The interlayer insulating layer 119 may be formed of silicon compounds. For example, the interlayer insulating layer 119 may include silicon oxide, silicon nitride, silicon oxynitride, silicon carbonitride, silicon oxycarbide, etc. The interlayer insulating layer 119 may serve to insulate the gate electrode 117 from the source electrode 120 and the drain electrode 121. The interlayer insulating layer 119 may be formed by a deposition method or the like, but is not limited thereto.

The source electrode 120 and the drain electrode 121 may be formed on the interlayer insulating layer 119. The source electrode 120 penetrates through the interlayer insulating layer 119 and the gate insulating layer 116 such that the source electrode 120 can be connected to the source region 113, and the drain electrode 121 penetrates through the interlayer insulating layer 119 and the gate insulating layer 116 such that the drain electrode 121 can be connected to the drain region 114.

Each of the source electrode 120 and the drain electrode 121 may include metal, alloy, metal nitride, conductive metal oxide, transparent conductive materials, etc. For example, each of the source electrode 120 and the drain electrode 121 may be formed of aluminum, aluminum-containing alloy, aluminum nitride, silver, silver-containing alloy, tungsten, tungsten nitride, copper, copper-containing alloy, nickel, chrome, chrome nitride, molybdenum, molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. The source electrode 120 and the drain electrode 121 may be formed by a photolithography or the like, but are not limited thereto.

The source electrode 120 and the drain electrode 121 form a thin film transistor (TFT) together with the active layer 111 and the gate electrode 117. The thin film transistor (TFT) may be a driving transistor which supplies current corresponding to the voltage being applied to the gate electrode 117 to a light emitting diode (i.e., a portion formed by 140, 160 and 170). Although not shown, the thin film transistor (TFT) may be connected to a switching transistor. The switching transistor applies voltage corresponding to a data signal supplied via a data line (not shown) to the thin film transistor (TFT) in response to a gate signal supplied via a gate line (not shown).

The flattening pattern 130 may be formed on the interlayer insulating layer 119 to cover the source electrode 120 and the drain electrode 121. The flattening pattern 130 may have a flat surface. The flattening pattern 130 may be arranged on a pixel basis. In some cases, the flattening pattern 130 may be integrated on the interlayer insulating layer 190.

The first electrode 140 is formed on the first insulating substrate 110 on a pixel basis. The first electrode 140 may be an anode electrode which receives a signal applied to the drain electrode 121 of the thin film transistor (TFT) and provides holes to the organic layer 160, or may be a cathode electrode which receives a signal applied to the drain electrode 121 of the thin film transistor (TFT) and provides electrons to the organic layer 160.

The first electrode 140 may be used as a transparent electrode or a reflective electrode. The first electrode 140 used as a transparent electrode may be formed of indium tin oxide (ITO), indium zinc oxide (IZO), zinc oxide (ZnO) or $In_2O_3$. In addition, the first electrode 140 used as a reflective electrode may include a reflective layer formed of Ag, Mg, Al, Pt, Pd, Au, Ni, Nd, Ir, Cr, and compounds thereof or the like, and a layer of ITO, IZO, ZnO or $In_2O_3$ formed on the reflective layer after the formation of the reflective layer. The first electrode 140 may be formed by a photolithography process, but is not limited thereto.

The pixel define layer 150 defines each pixel on the first insulating substrate 110, and has an opening 151 for exposing the first electrode 140. Thus, the pixel define layer 150 enables the organic layer 160 to be formed on the first electrode 140 via the opening 151. The pixel define layer 150 is formed of an insulating material. Specifically, the pixel define layer 150 may be formed of at least one organic material selected from benzocyclobutene (BCB), polyimide (PI), polyamide (PA), acrylic resin, phenol resin, etc. In another example, the pixel define layer 150 may be formed of an inorganic material such as silicon nitride. The pixel define layer 150 may be formed by a photolithography process, but is not limited thereto.

In a non-limiting example, the pixel define layer 150 may be formed of an insulating material which enables the contact angle of the organic layer 160 to the pixel define layer 150 to be greater than the contact angle of the organic layer 160 to the first electrode 140 when the organic layer 160 is formed by an inkjet print method or a nozzle print method. For example, the pixel defining layer 150 may be formed of an insulating material which enables the contact angle of the organic layer 160 to the pixel define layer 150 to be 40° or bigger.

The organic layer 160 is formed on the first electrode 140 which is exposed via the opening 151 of the pixel define layer 150. The organic layer 160 may include an organic emission layer which recombines holes provided from the first electrode 140 and electrons provided from the second electrode 170 so as to emit light. More specifically, when holes and electrons are provided to the organic emission layer, the holes and electrons are combined to form exciton, and thus-formed exciton is reduced from an excited state to a bottom state to emit light.

The organic emission layer may be disposed in the region where a red color filter 230R for emitting red light, a green color filter 230G for emitting green color, and a blue color filter 230B for emitting blue color are overlapped with each other in each pixel.

The organic emission layer may be formed by an inkjet print method or a nozzle print method, but is not limited thereto. In the case of forming the organic emission layer by an inkjet print method or a nozzle print method, the organic emission layer is formed by dropping organic emission ink including a solid light emitting material and a solvent on the first electrode 140 exposed by the opening 151 of the pixel define layer 150, and drying the dropped organic emission ink by a separate drying process in a vacuum atmosphere.

The organic emission layer may include, as a host, Alq3 (tris-(8-hydroyquinolato) aluminum(III)), CBP (4,4'-N,N'-dicarbazole-biphenyl), PVK (poly(N-vinylcarbazole)), ADN (9,10-Bis(2-naphthalenyl)anthracene), TCTA (4,4',4"-tris(Ncarbazolyl)triphenylamine), TPBi (1,3,5-tris(N-phenylbenzimiazole-2-yl)benzene), TBADN (2-(t-butyl)-9, 10-bis(20-naphthyl)anthracene), DSA (distyrylarylene), CDBP (4,4'-Bis(9-carbazolyl)-2,2'-dimethyl-biphenyl), MADN (2-Methyl-9,10-bis(naphthalen-2-yl)anthracene), etc.

The organic layer 160 may further include, in addition to the organic emission layer, a hole injection layer and a hole transport layer provided between the first electrode 140 and the organic emission layer. The hole injection layer and the hole transport layer may be formed by an inkjet print method or a nozzle print method, but is not limited thereto.

The hole injection layer may be formed on the first electrode 140, and may serve to improve efficiency of hole injection from the first electrode 140 to the organic emission layer. Specifically, the hole injection layer lowers an energy barrier to enable more effective injection of holes.

The hole injection layer may include phthalocyanine compounds such as copper phthalocyanine (CuPc), m-MTDATA (4,4',4"-tris(N-3-methylphenyl-N-phenylamino)triphenylamine), TDATA (4,4',4"-tris(diphenylamino)triphenylamine), 2-TNATA (4,4',4"-tris[2-naphthyl(phenyl)-amino]triphenyl-amine), Pani/DBSA (polyaniline/dodecylbenzenesulfonic acid), PEDOT/PSS (poly(3,4-ethylene dioxythiophene)/polystyrene sulfonate), PANI/CSA (polyaniline/camphorsulfonic acid) or PANI/PSS (polyaniline/polystyrene sulfonate), etc.

The hole transport layer is formed on the hole injection layer, and serves to transport holes injected to the hole injection layer to the organic emission layer.

The hole transport layer may have optimized hole transport efficiency when the energy of the highest occupied molecular orbital (HOMO) is substantially lower than the work function of the material forming the first electrode 140 and substantially higher than the energy of the highest occupied molecular orbital (HOMO) of the organic emission layer.

The hole transport layer may include NPD (4,4'-bis[N-(1-naphthyl)-N-phenyl-amino]biphenyl), TPD (N,N'-diphenyl-N,N'-bis[3-methylphenyl]-1,1'-biphenyl-4,4'-diamine), s-TAD (2,2',7,7'-tetrakis-(N,N-diphenylamino)-9,9'-spirobifluorene), m-MTDATA (4,4',4"-tris(N-3-methylphenyl-N-phenylamino)triphenylamine) and the like, but is not limited thereto.

Furthermore, the organic layer 160 may further include an electron injection layer and an electron transport layer provided between the organic emission layer and the second electrode 170.

The electron transport layer is formed on the organic emission layer, and serves to transport electrons injected from the electron injection layer to the organic emission layer.

The electron transport layer may include Alq3 (tris-(8-hydroxyquinolato) aluminum(III)), TPBi (1,3,5-tris(N-phenylbenzimiazole-2-yl)benzene), BCP (2,9-dimethyl-4,7-diphenyl-1,10-phenanthroline), Bphen (4,7-diphenyl-1,10-phenanthroline), TAZ (3-(biphenyl-4-yl)-5-(4-tert-butylphenyl)-4-phenyl-4H-1,2,4-triazole), NTAZ (4-(naphthalen-1-yl)-3,5-diphenyl-4H-1,2,4-triazole), tBu-PBD (2-(4-biphenylyl)-5-(4-tert-butyl-phenyl)-1,3,4-oxadiazole), BAlq (bis(2-methyl-8-quinolinolato-N1,O8)-(1,1'-biphenyl-4-olato)aluminum), Bebq2 (bis(10-hydroxybenzo[h]quinolinato)beryllium), ADN (9,10-bis(2-naphthyl)anthracene) and a mixture thereof, but is not limited thereto.

The electron injection layer is formed on the electron transport layer, and serves to improve efficiency of electron injection from the second electrode 170 to the organic emission layer.

The electron injection layer may be formed of LiF, lithium quinolate (LiQ), $Li_2O$, BaO, NaCl, CsF, lanthanum-group metal such as Yb, or metal halides such as RbCl and RbI, but is not limited thereto. The electron injection layer may also be formed of a mixture of the above-enumerated material and insulating organo-metal salt. The applied organo-metal salt may be a material having an energy band gap of approximately 4 eV or higher. In a more specific example, the organo-metal salt may include metal acetate, metal benzoate, metal acetoacetate, metal acetylacetonate or metal stearate.

The hole injection layer and the hole transport layer may be formed by a deposition method, but are not limited thereto. Of course, when the first electrode 140 is a cathode electrode and the second electrode 170 is an anode electrode, the electron injection layer and the electron transport layer may be provided between the first electrode 140 and the organic emission layer, and the hole injection layer and the hole transport layer may be provided between the organic emission layer and the second electrode 170.

The second electrode 170 is formed on the organic layer 160, and may be a cathode electrode for providing electrons to the organic layer 160 or an anode electrode for providing holes to the organic layer 160. The second electrode 170 may be used as a transparent electrode or a reflective electrode similarly to the first electrode 110. The second electrode 170 may be formed by a deposition process or the like, but is not limited thereto.

Although not shown, the organic light emitting diode may further include an encapsulation substrate (not shown) disposed on the second electrode 170. The encapsulation substrate may be an insulating substrate. A spacer (not shown)

may be interposed between the second electrode 170 and the encapsulation substrate on the pixel define layer 150. In some embodiments of the present invention, the encapsulation substrate may be omitted. In such a case, an encapsulation layer formed of an insulating material may cover and protect the whole structure.

The second insulating substrate 210 may be transparent. The second insulating substrate 210 may be formed of a material such as glass, quartz, and polymer resin. Examples of the polymer material include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT or TAC), cellulose acetate propionate: CAP) or a combination thereof. In some embodiments, the insulating substrate may be a flexible substrate formed of a flexible material such as polyimide (PI).

The opaque layer 220 may be formed on the second insulating substrate 210. The opaque layer 220 may block incident light, and may also define the blue color filter 230B, the green color filter 230G, and the red color filter 230R. The opaque layers 220 may be spaced apart from each other, and the blue color filter 230B, the green color filter 230G, and the red color filter 230R may be provided between the opaque layers 220. The opaque layer 220 may be a black matrix, which can be formed of an opaque metal film such as chrome by a sputtering method, or formed of resins colored by dye or a pigment.

The color filter layer 230 may be formed on the second insulating substrate 210. The color filter layer 230 may include the blue color filter 230B, the green color filter 230G, and the red color filter 230R. The opaque layer 220 may be provided among the blue color filter 230B, the green color filter 230G, and the red color filter 230R.

The blue color filter 230B may be formed by depositing a negative blue photosensitive resist having spectral characteristics of transmitting only light of a blue wavelength range and absorbing light of other wavelength ranges, exposing the negative blue photosensitive resist using a mask having an opening, and performing a development process.

The green color filter 230G may be formed by depositing a negative green photosensitive resist having spectral characteristics of transmitting only light of a green wavelength range and absorbing light of other wavelength ranges, exposing the negative green photosensitive resist using a mask having an opening, and performing a development process.

The red color filter 230R may be formed by depositing a negative red photosensitive resist having spectral characteristics of transmitting only light of a red wavelength range and absorbing light of other wavelength ranges, exposing the negative red photosensitive resist using a mask having an opening, and performing a development process.

Each of the blue photosensitive resist, the green photosensitive resist, and the red photosensitive resist may include surface-modified metal particles PCs, photoinitiators, polymer binders, pigment, dye, pigment dispersing agents, monomers, and solvents.

Referring to FIG. 1 and FIG. 2, the surface-modified metal particle PC is structured in that the surface of metal particle M is modified with hydrocarbon compounds.

In existing methods, a leveling agent for dispersing solids is used in each of a photosensitive resist for a blue color filter, a photosensitive resist for a green color filter, and a photosensitive resist for a red color filter. The hydrocarbon compound CM may serve as a dispersing agent in a photosensitive resist for a color filter, and therefore, the method of manufacturing the display panel according to the embodiment may eliminate the necessity of using an existing leveling agent for dispersing solids.

The blue color filter 230B includes first surface-modified metal particles 1PCs, the green color filter 230G includes second surface-modified metal particles 2PCs, and the red color filter 230R includes third surface-modified metal particles 3PCs. The first surface-modified metal particles 1PCs are sufficiently dispersed in the blue color filter 230B, and thus are spaced apart from each other so that the first surface-modified metal particles 1PCs may not electromagnetically influence each other. The second surface-modified metal particles 2PCs are sufficiently dispersed in the green color filter 230G, and thus are spaced apart from each other so that the second surface-modified metal particles 2PCs may not electromagnetically influence each other. The third surface-modified metal particles 3PCs are sufficiently dispersed in the red color filter 230R, and thus are spaced apart from each other so that the third surface-modified metal particles 3PCs may not electromagnetically influence each other.

The first surface-modified metal particles 1PCs have a mean diameter smaller than that of the second surface-modified metal particles 2PCs. In addition, the second surface-modified metal particles 2PCs have a mean diameter smaller than that of the third surface-modified metal particles 3PCs.

In a non-limiting example, the first surface-modified metal particles 1PCs may include spherical silver (Ag) particles in which metal particles M have a mean diameter ranging from 20 nm to 40 nm, the second surface-modified metal particles 2PCs may include spherical silver (Ag) particles in which metal particles M have a mean diameter exceeding 40 nm but not exceeding 70 nm, and the third surface-modified metal particles 3PCs may include spherical silver (Ag) particles in which metal particles M have a mean diameter exceeding 70 nm but not exceeding 100 nm.

The metal particles M may exhibit a strong extinction phenomenon in a specific wavelength, and such a strong extinction phenomenon of the metal particles M in a specific wavelength may increase electron excitation of an adjacent fluorescent substance.

As shown in the following expression 1, photon extinction ratio per unit area ($\sigma_{Ext}$) is the sum of photon scattering ratio per unit area ($\sigma_{Sca}$) and photon absorption ratio per unit area ($\sigma_{Abs}$). The metal particles M may increase luminance of color by an increase in photon scattering ratio per unit area in a specific wavelength.

$$\sigma_{Ext} = \sigma_{Abs} + \sigma_{Sca}$$

$$\sigma_{Sca} = \frac{8\pi}{3} k^4 a^6 \left| \frac{\varepsilon - \varepsilon_m}{\varepsilon + 2\varepsilon_m} \right|$$

$$\sigma_{Abs} = 4\pi k a^3 \mathrm{Im} \left| \frac{\varepsilon - \varepsilon_m}{\varepsilon + 2\varepsilon_m} \right|,$$

Expression 1 wherein, $\sigma_{Ext}$ is the photon extinction ratio per unit area, $\sigma_{Abs}$ is the photon absorption ratio per unit area, $\sigma_{Sca}$ is the photon scattering ratio per unit area, k is $2\pi/\lambda$, $\lambda$ is the wavelength of light, a is the radius of a spherical metal particle, $\in$ is dielectricity of the metal particle, and $\in_m$ is dielectricity of substances adjacent to the metal particle.

As shown in the following expression 2, amplified photon absorption ratio per unit area ($\sigma_{Abs}$) may increase the intensity of an adjacent fluorescent substance ($P_{Fluo}$).

$$P_{Fluo} = Q\sigma_{Abs}(\overline{\omega}_L)S_{Inc} = QM_{Loc}(\overline{\omega}_L)\sigma_{Abs}^0(\overline{\omega}_L)S_{Inc} \quad \sigma_{Abs}(\overline{\omega}_L) = M_{Loc}(\overline{\omega}_L)\sigma_{Abs}^0(\overline{\omega}_L)$$
Expression 2 wherein, $P_{Fluo}$ is the intensity of a fluorescent substance, Q is the quantum efficiency of the fluorescent substance, $M_{Loc}$ is an amplifying element by localized plasmon, $\sigma_{Abs}$ is the amplified photon absorption ratio per unit, $\sigma_{Abs}^0$ is the photon absorption ratio per unit area, and $S_{Inc}$ is electron excitation density.

The metal particles M may exhibit a higher extinction phenomenon in a higher wavelength as the size of the metal particle increases. Accordingly, the mean diameter of the metal particles M may increase least in the blue color filter 230B, next least in the green color filter 230G, and most in the red green filter 230R. The blue color filter 230B may include first metal particles having a first mean diameter, the green color filter 230G may include second metal particles having a second mean diameter larger than the first mean diameter and the red color filter 230R may include third metal particles having a third mean diameter larger than the second mean diameter.

For example, the spherical silver (Ag) particles having a mean diameter of 20 nm to 40 nm may exhibit the highest extinction phenomenon in light having a wavelength of approximately 450 nm, the spherical silver (Ag) particles having a mean diameter exceeding 40 nm but not exceeding 70 nm may exhibit the highest extinction phenomenon in light having a wavelength of approximately 500 nm, and the spherical silver (Ag) particles having a mean diameter exceeding 70 nm but not exceeding 100 nm may exhibit the highest extinction phenomenon in light having a wavelength exceeding approximately 600 nm.

The overcoat layer OC may be formed on the color filter layer 230 and the opaque layer 220 to cover the whole area of the color filter layer 230 and the opaque layer 220. The overcoat layer OC may serve to compensate for a step difference caused due to a height difference between the color filter layers 230B, 230G, 230R and the opaque layer 220. The overcoat layer OC may also serve to increase luminance. Specifically, a white organic light emitting diode may exhibit high luminance in the wavelength of 450, 470, 520, 620 nm when the overcoat layer OC exists.

The overcoat layer OC may be formed of a hydrophobic polymer material. However, the overcoat layer OC is not limited thereto.

The common electrode 240 may provide a common voltage to a display panel, and may be formed of indium tin oxide (ITO), indium zinc oxide (IZO), zinc oxide (ZnO) or $In_2O_3$ and the like.

FIG. 4 to FIG. 8 are graphical representations illustrating the relationship between a wavelength and a fluorescence intensity.

As shown in FIG. 4 to FIG. 8, surface-modified silver particles in which surfaces of silver (Ag) particles are surface-modified with dodecane may exhibit different fluorescence intensities in a blue wavelength range, a green wavelength range and a red wavelength range according to sizes of the surface-modified silver particles.

Figure 4:
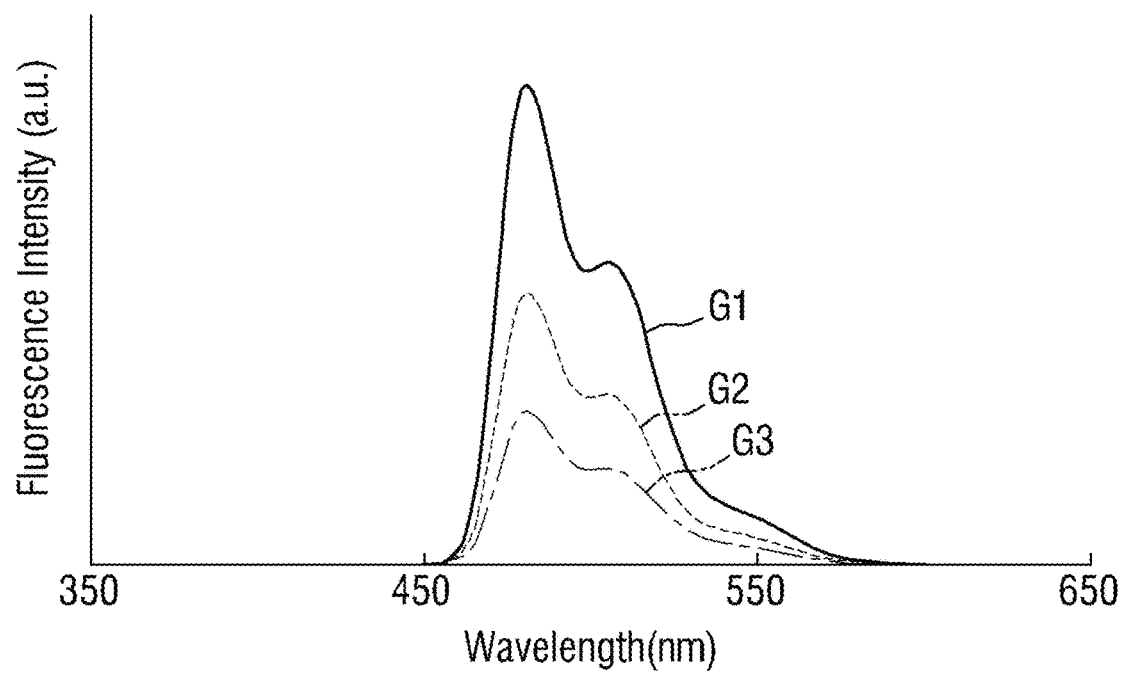
FIG. 4 to FIG. 8 are graphical representations illustrating the relationship between a wavelength and a fluorescence intensity.

FIG. 4 shows the result of the fluorescence intensity measurement in which fluorescent dye exhibiting the strongest excitation of electrons in the wavelength of 450 nm is used while varying the mean diameter of surface-modified silver particles.

Referring to FIG. 4, a first curve G1 shows the fluorescence intensity of surface-modified silver particles having a mean diameter of 30 nm in a blue wavelength range, a second curve G2 shows the fluorescence intensity of surface-modified silver particles having a mean diameter of 55 nm in the blue wavelength range, and a third curve G3 shows the fluorescence intensity of surface-modified silver particles having a mean diameter of 90 nm in the blue wavelength range. As illustrated, the first curve G1 shows the highest fluorescence intensity, and the third curve G3 shows the lowest fluorescence intensity. The surface-modified silver particles having a mean diameter of 30 nm exhibit the highest extinction in the wavelength of 450 nm and the highest emission in the wavelength of 480 nm. On the other hand, the surface-modified silver particles having a mean diameter of 90 nm exhibit the lowest extinction in the wavelength of 450 nm and the lowest emission in the wavelength of 480 nm.

Figure 5:
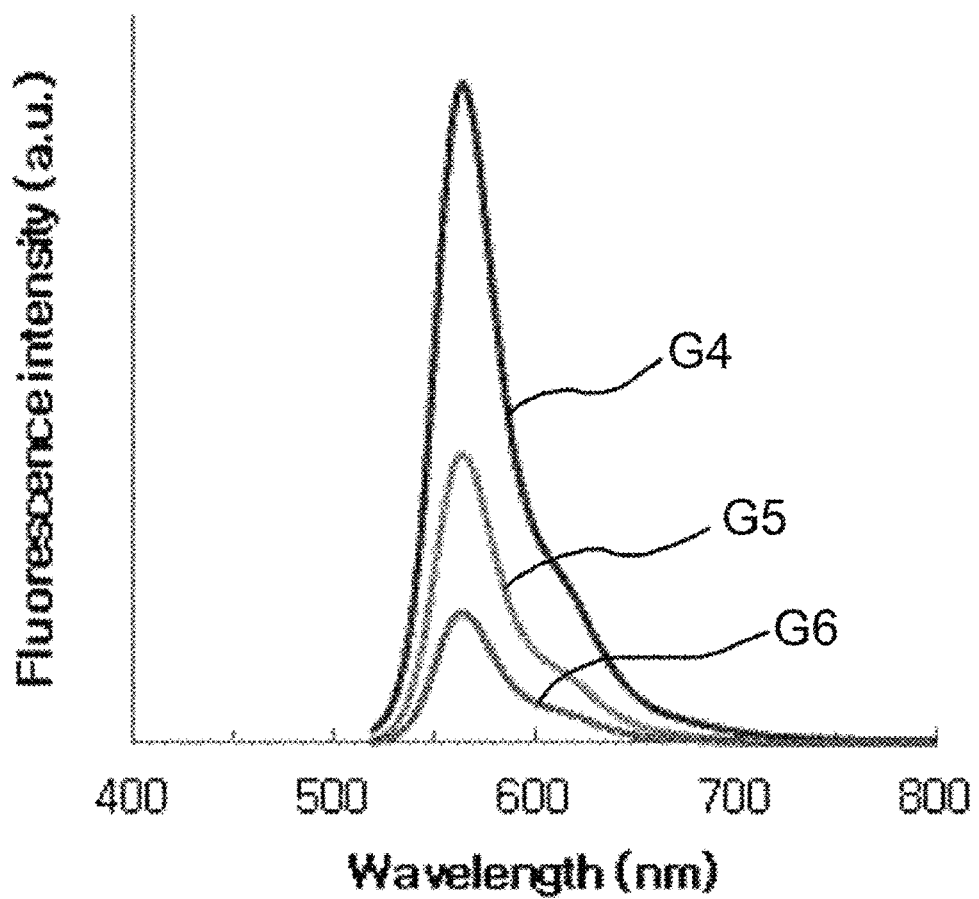

FIG. 5 shows the result of the fluorescence intensity measurement in which the fluorescent dye exhibiting the highest excitation of electrons in the wavelength of 510 nm is used while varying the mean diameter of surface-modified silver particles.

Referring to FIG. 5, a fourth curve G4 shows the fluorescence intensity of surface-modified silver particles having a mean diameter of 50 nm in a green wavelength range, a fifth curve G5 shows the fluorescence intensity of surface-modified silver particles having a mean diameter of 30 nm in the green wavelength range, and a sixth curve G6 shows the fluorescence intensity of surface-modified silver particles having a mean diameter of 90 nm in the green wavelength range. As illustrated, the fourth curve G4 shows the highest fluorescence intensity, and the sixth curve G6 shows the lowest fluorescence intensity. The surface-modified silver particles having a mean diameter of 50 nm exhibit the highest extinction in the wavelength of 510 nm and the highest emission in the wavelength of 565 nm. On the other hand, the surface-modified silver particles having a mean diameter of 90 nm exhibit the lowest extinction in the wavelength of 510 nm and the lowest emission in the wavelength of 565 nm.

Figure 6:
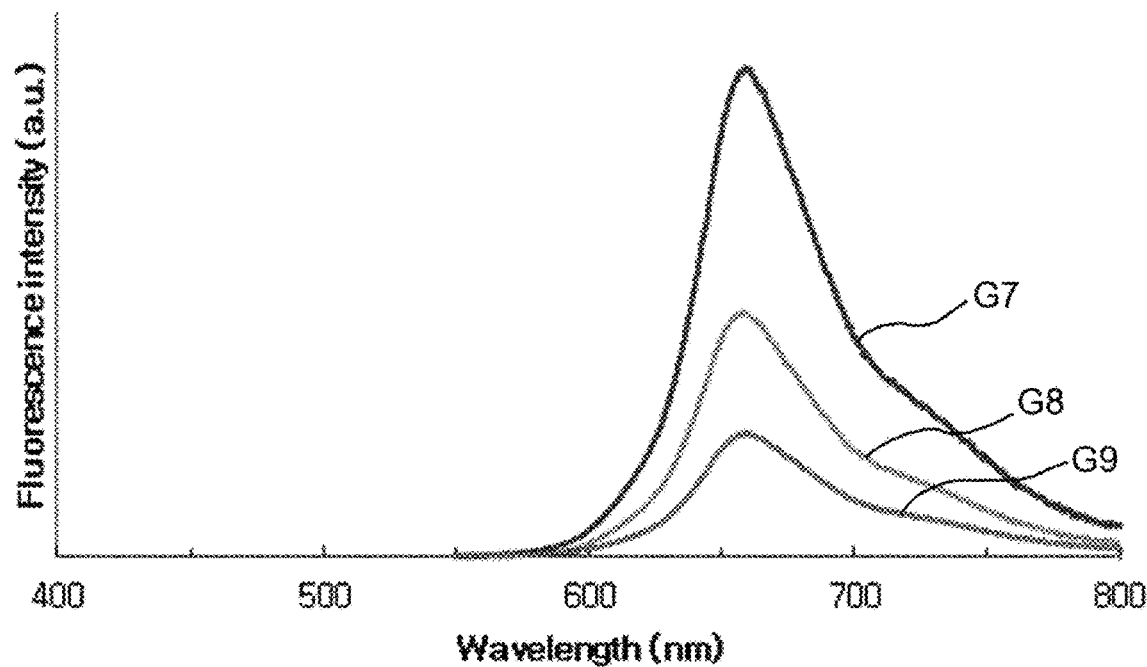

FIG. 6 shows the result of the fluorescence intensity measurement in which the fluorescent dye exhibiting the highest excitation of electrons in the wavelength of 540 nm is used while varying the mean diameter of surface-modified silver particles.

Referring to FIG. 6, a seventh curve G7 shows the fluorescence intensity of surface-modified silver particles having a mean diameter of 90 nm in a red wavelength range, an eighth curve G8 shows the fluorescence intensity of surface-modified silver particles having a mean diameter of 30 nm in the red wavelength range, and a ninth curve G9 shows the fluorescence intensity of surface-modified silver particles having a mean diameter of 55 nm in the red wavelength range. As illustrated, the seventh curve G7 shows the highest fluorescence intensity, and the ninth curve G9 shows the lowest fluorescence intensity. The surface-modified silver particles having a mean diameter of 90 nm exhibit the highest extinction in the wavelength of 540 nm and the highest emission in the wavelength of 657 nm. On the other hand, the surface-modified silver particles having a mean diameter of 55 nm exhibit the lowest extinction in the wavelength of 540 nm and the lowest emission in the wavelength of 657 nm.

Figure 7:
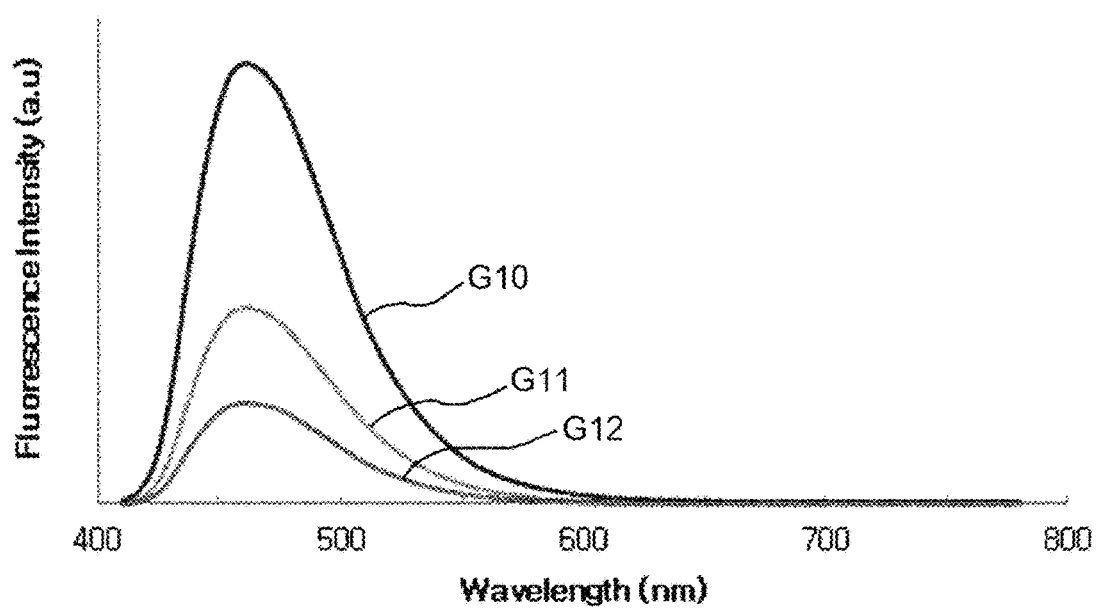

FIG. 7 shows the result of the fluorescence intensity measurement in which the fluorescent dye exhibiting the highest excitation of electrons in the wavelength of 437 nm is used while varying the mean diameter of surface-modified silver particles.

Referring to FIG. 7, a tenth curve G10 shows the fluorescence intensity of surface-modified silver particles having a mean diameter of 30 nm in a blue wavelength range, an eleventh curve G11 shows the fluorescence intensity of surface-modified silver particles having a mean diameter of 55 nm in the blue wavelength range, and a twelfth curve G12 shows the fluorescence intensity of surface-modified silver particles having a mean diameter of 90 nm in the blue wavelength range. As illustrated, the tenth curve G10 shows the highest fluorescence intensity, and the twelfth curve G12 shows the lowest fluorescence intensity. The surface-modified silver particles having a mean diameter of 30 nm exhibit the highest extinction in the wavelength of 437 nm and the highest emission in the wavelength of 477 nm. On the other hand, the surface-modified silver particles having a mean diameter of 90 nm exhibit the lowest extinction in the wavelength of 437 nm and the lowest emission in the wavelength of 477 nm.

Figure 8:
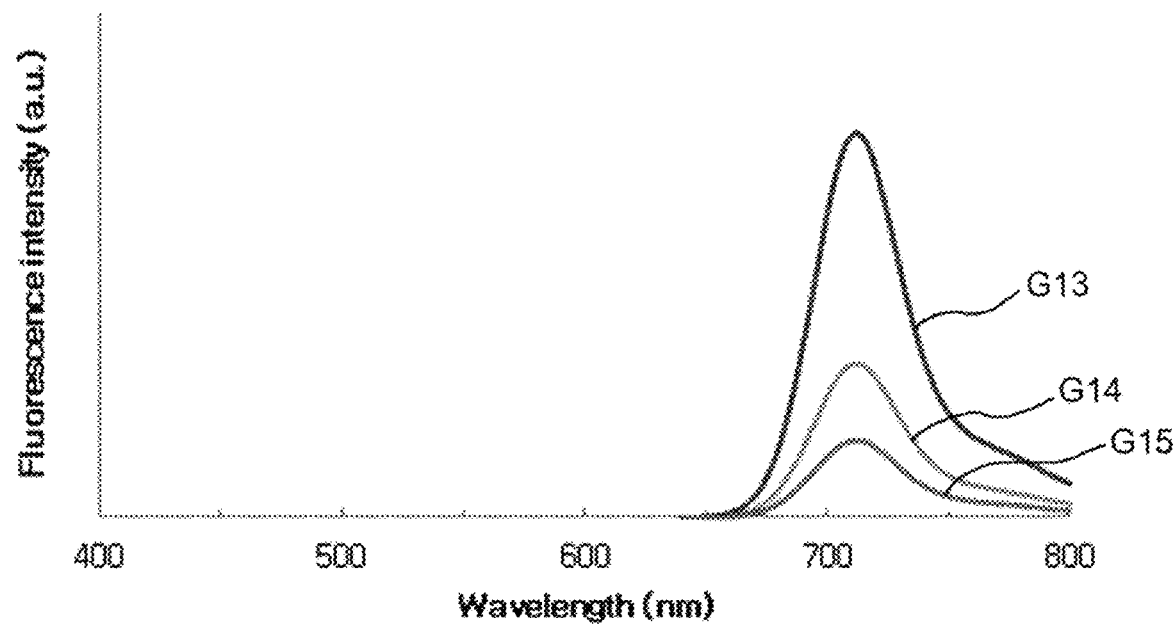

FIG. 8 shows the result of the fluorescence intensity measurement in which the fluorescent dye exhibiting the highest excitation of electrons in the wavelength of 630 nm is used while varying the mean diameter of surface-modified silver particles.

Referring to FIG. 8, a thirteenth curve G13 shows the fluorescence intensity of surface-modified silver particles having a mean diameter of 90 nm in a red wavelength range, a fourteenth curve G14 shows the fluorescence intensity of surface-modified silver particles having a mean diameter of 55 nm in the red wavelength range, and a fifteenth curve G15 shows the fluorescence intensity of surface-modified silver particles having a mean diameter of 30 nm in the red wavelength range. As illustrated, the thirteenth curve G13 shows the highest fluorescence intensity, and the fifteenth curve G15 shows the lowest fluorescence intensity. The surface-modified silver particles having a mean diameter of 30 nm exhibit the highest extinction in the wavelength of 630 nm and the highest emission in the wavelength of 712 nm. On the other hand, the surface-modified silver particles having a mean diameter of 90 nm exhibit the lowest extinction in the wavelength of 630 nm and the lowest emission in the wavelength of 712 nm.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope of the present disclosure as defined by the following claims.

What is claimed is:

1. A color filter substrate comprising:
an insulating substrate; and
a color filter layer including a blue color filter and a green color filter spaced apart from each other on the insulating substrate,
wherein the blue color filter includes metal particles, and the green color filter includes metal particles,
wherein first metal particles defined as metal particles included in the blue color filter have a first mean diameter,
wherein second metal particles defined as metal particles included in the green color filter have a second mean diameter,
wherein the second mean diameter is larger than the first mean diameter, and
wherein the first metal particles have a mean diameter ranging from 20 nm to 40 nm.

2. The color filter substrate of claim 1,
wherein the color filter layer further comprises a red color filter,
the red color filter being spaced apart from the blue color filter and the green color filter,
wherein third metal particles defined as metal particles included in the red color filter have a third mean diameter, and
wherein the third mean diameter is larger than the second mean diameter.

3. The color filter substrate of claim 2, wherein each of the first metal particles, the second metal particles, and the third metal particles is one or more selected from a group consisting of gold (Au), silver (Ag), aluminum (Al), alumina (Al2O3), cobalt (Co), copper (Cu), chrome (Cr), platinum (Pt), nickel (Ni), iron (Fe), molybdenum (Mo) and tungsten (W).

4. The color filter substrate of claim 2, wherein the blue color filter includes, as the metal particles, silver particles, the green color filter includes, as the metal particles, silver particles having a mean diameter exceeding 40 nm but not exceeding 70 nm, and the red color filter includes, as the metal particles, silver particles having a mean diameter exceeding 70 nm but not exceeding 100 nm.

5. The color filter substrate of claim 2, wherein the first metal particles, the second metal particles, and the third metal particles are spherical metal particles.

6. The color filter substrate of claim 1, further comprising an opaque layer formed on the insulating substrate between the green color filter and the blue color filter.

7. The color filter substrate of claim 6, further comprising an overcoat layer formed on the color filter layer and the opaque layer.

8. The color filter substrate of claim 7, further comprising a common electrode disposed on the overcoat layer.

9. A display panel comprising:
a color filter substrate in which a color filter layer is formed on an insulating substrate;
and an opposed substrate facing the color filter substrate,
wherein the color filter layer includes a blue color filter, a green color filter, and a red color filter spaced apart from each other,
wherein each of the blue color filter, the green color filter, and the red color filter includes surface-modified metal particles including metal particles and hydrocarbon compound surface modification layer covering the metal particles,
wherein the blue color filter includes first metal particles having a first mean diameter, the green color filter includes second metal particles having a second mean diameter larger than the first mean diameter and the red color filter includes third metal particles having a third mean diameter larger than the second mean diameter.

10. The display panel of claim 9, wherein the metal particles are one or more selected from a group consisting of gold (Au), silver (Ag), aluminum (Al), alumina (Al2O3), cobalt (Co), copper (Cu), chrome (Cr), platinum (Pt), nickel (Ni), iron (Fe), molybdenum (Mo) and tungsten (W).

11. The display panel of claim 9, wherein the blue color filter includes, as the metal particles, silver particles having a mean diameter ranging from 20 nm to 40 nm, the green color filter includes, as the metal particles, silver particles having a mean diameter exceeding 40 nm but not exceeding 70 nm, and the red color filter includes, as the metal particles, silver particles having a mean diameter exceeding 70 nm but not exceeding 100 nm.

12. The display panel of claim 9, wherein the hydrocarbon compounds have 6 to 20 carbon atoms.

13. The display panel of claim 12, the hydrocarbon compounds are one or more saturated hydrocarbon compounds selected from a group consisting of hexane ($C_6H_{14}$), heptane ($C_7H_{16}$), octane ($C_8H_{18}$), nonane ($C_9H_{20}$), decane ($C_{10}H_{22}$), undecane ($C_{11}H_{24}$), dodecane ($C_{12}H_{26}$), tridecane ($C_{13}H_{28}$), tetradecane ($C_{14}H_{30}$), pentadecane ($C_{15}H_{32}$), hexadecane ($C_{16}H_{34}$), heptadecane ($C_{17}H_{36}$), octadecane ($C_{18}H_{38}$), nonadecane ($C_{19}H_{40}$) and eicosane ($C_{20}H_{42}$).

14. The display panel of claim 9, wherein the metal particles are spherical metal particles.

15. The display panel of claim 9, further comprising an opaque layer formed on the insulating substrate among the green color filter, the blue color filter, and the red color filter.

16. The display panel of claim 15, further comprising an overcoat layer formed on the color filter layer and the opaque layer.

17. The display panel of claim 16, further comprising a common electrode disposed on the overcoat layer.

18. The display panel of claim 9, wherein the opposed substrate further comprises an organic emission layer formed on the insulating substrate.

19. A color filter substrate comprising:
an insulating substrate; and
a color filter layer including a blue color filter and a green color filter spaced apart from each other on the insulating substrate,
wherein the blue color filter includes first metal particles having mean diameter ranging from 20 nm to 40 nm, and the green color filter includes second metal particles having mean diameter exceeding 40 nm but not exceeding 70 nm.

20. A color filter substrate comprising:
an insulating substrate; and
a color filter layer including a blue color filter and a green color filter spaced apart from each other on the insulating substrate,
wherein the blue color filter includes metal particles, and the green color filter includes metal particles,
wherein a diameter of each of the metal particles of the blue color filter is smaller than a diameter of each of the metal particles of the green color filter, and
wherein the blue color filter includes, the metal particles having a mean diameter ranging from 20 nm to 40 nm.

* * * * *